United States Patent [19]

Niwa et al.

[11] Patent Number: 4,741,989
[45] Date of Patent: May 3, 1988

[54] POSITIVE PHOTORESIST AQUEOUS DEVELOPER SOLUTION CONTAINING QUATERNARY AMMONIUM HYDROXIDE WITH ALIPHATIC KETONE OR CYCLIC ETHER ALONE OR WITH AMINE AS DEVELOPMENT MODIFIER

[75] Inventors: Kenji Niwa; Ichiro Ichikawa, both of Chiba, Japan

[73] Assignee: Sumitomo Chemical Company, Limited, Osaka, Japan

[21] Appl. No.: 869,858

[22] Filed: May 28, 1986

Related U.S. Application Data

[63] Continuation of Ser. No. 596,113, Apr. 2, 1984, abandoned.

[30] Foreign Application Priority Data

Apr. 1, 1983 [JP] Japan .................. 58-58386

[51] Int. Cl.⁴ .................. G03C 5/00; G03C 5/34
[52] U.S. Cl. .................. 430/331; 252/156; 252/528; 252/529; 252/541; 252/547; 252/548; 430/149; 430/154; 430/309; 430/325; 430/326
[58] Field of Search .................. 430/331, 154, 309, 325, 430/326, 149, 192, 190; 252/547, 541, 548, 528, 529, 156

[56] References Cited

U.S. PATENT DOCUMENTS

| | | | |
|---|---|---|---|
| 3,902,906 | 9/1975 | Iwama et al. | 430/190 |
| 4,141,733 | 2/1979 | Guild | 430/141 |
| 4,191,573 | 3/1980 | Toyoma et al. | 430/166 |
| 4,239,661 | 12/1980 | Muraoka et al. | 252/541 |
| 4,411,981 | 10/1983 | Minezaki | 430/299 |
| 4,464,461 | 8/1984 | Guild | 430/331 |
| 4,536,465 | 8/1985 | Uehara et al. | 430/192 |
| 4,555,469 | 11/1985 | Erdmann et al. | 430/192 |

FOREIGN PATENT DOCUMENTS

| | | | |
|---|---|---|---|
| 62733 | 10/1982 | European Pat. Off. | 430/331 |
| 58-57128 | 4/1983 | Japan . | |
| 58-82243 | 5/1983 | Japan . | |
| 58-150949 | 9/1983 | Japan . | |
| 59-62850 | 4/1984 | Japan . | |
| 59-220732 | 12/1984 | Japan . | |
| 59-219743 | 12/1984 | Japan . | |

OTHER PUBLICATIONS

Patent Abstract of Japan, vol. 6, No. 209 (P-150) [1087], Oct. 21, 1982, of JPA-57-114141.

Primary Examiner—Charles L. Bowers, Jr.
Attorney, Agent, or Firm—Sughrue, Mion, Zinn, Macpeak, and Seas

[57] ABSTRACT

A developer for positive photoresists which can improve the sensitivity and resolution of the resist is disclosed. The developer comprises an aqueous solution of a quaternary ammonium hydroxide represented by the formula (I):

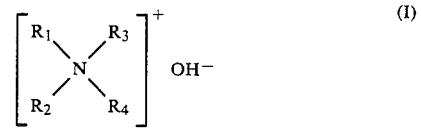

wherein $R_1$, $R_2$, $R_3$, and $R_4$ are each an alkyl group having 1 to 4 carbon atoms or a hydroxyalkyl group having 1 to 5 carbon atoms, and at least one development modifier selected from the group consisting of water-soluble aliphatic ketones, cyclic ethers, and tertiary amines, and optionally, at least one another development modifier selected from the group consisting of water-soluble primary amines and secondary amines.

8 Claims, No Drawings

POSITIVE PHOTORESIST AQUEOUS DEVELOPER SOLUTION CONTAINING QUATERNARY AMMONIUM HYDROXIDE WITH ALIPHATIC KETONE OR CYCLIC ETHER ALONE OR WITH AMINE AS DEVELOPMENT MODIFIER

This is a continuation of application Ser. No. 596,113, filed Apr. 2, 1984, now abandoned.

FIELD OF THE INVENTION

The present invention relates to a developer for positive photoresists. More particularly, it relates to an organic alkali developer which has an improved ability to develop positive photoresists containing a quinonediazido group as a sensitizer.

BACKGROUND OF THE INVENTION

As everybody knows, the electronic industry has recently made remarkable progress and IC has evolved into LSI and further into VLSI with an ever-increasing density of integration. This progress has aroused a demand for an improved photolithographic technology capable of forming finer patterns with a better resolution than before. To meet this demand, there is a general tendency that a conventional cyclized-rubber type negative photoresist is replaced by a quinonediazide type positive photoresist. The former has a disadvantage of becoming swollen and deformed by the developer during development, whereas the latter slightly suffers from such a disadvantage and provides sharp patterns with a better relolution.

As quinonediazide type positive photoresists, a naphthoquinonediazide is more popular than a benzoquinonediazide because of its high sensitivity. The former is commercially available in the form of a mixture or a condensate with novolak resin. Examples of such positive photoresists which are well known include AZ-1350J (a product of Shipley Co.), KMPR-809 (a product of Eastman Kodak Company), HPR-104 (a product of Hunt Chemical), and OFPR-800 (a roduct of Tokyo Ohka Kogyo Co., Ltd.).

The reaction mechanism of such quinonediazide type positive phtoresist during the exposure and development is not yet completely elucidated. It is considered that when exposed through a mask to light having a wavelength of 365 to 436 nm, the quinodiazide in the exposed area liberates nitrogen to form a ketene or carbonyl which upon contact with a trace amount of moisture, is then converted into an alkali-soluble indenecarboxylic acid.

Thus it follows that there will be no problem if the quinonediazide is exposed sufficiently. However, an increase of exposure energy causes a failure of sharpness of fine patterns. On the other hand, from the standpoints of economy and productivity, a shorter time of exposure is preferred. For these reasons, there is a tendency toward the reduction of exposure energy. In this case, the dimension precision is improved, but the quinonediazide sensitizer partially remains unsensitized in the exposed area. This phenomenon happens remarkably in a lower portion of the photoresist thin film. It is a well known fact that in patterning of aluminum interconnections, the quinonediazide is hardly sensitized because a stationary wave phenomenon occurs in the exposed area and light intensity extremely decreases in the vicinity of the aluminum surface. If the development is carried out in such a state, the boundary portions between the undissolved photoresist pattern areas and the dissolved areas, i.e., so-called corner edge portions and bottom portions of the dissolved photoresist pattern, partly remain without being dissolved, to thereby cause a great loss of dimension precision and a great decrease of yields.

So far, no effective solution has been presented to this problem. There is proposed in Japanese Patent Application (OPI) No. 162746/1981 a developer which is an aqueous solution of tetramethylammonium hydroxide containing a certain amount of a novolak resin. This proposal is intended to improve affinity of the developer with the photoresist film surface to render the dissolution with an alkali uniform, to thereby improve poor development in the photoresist surface. In other words, it is not intended to overcome the defective development caused by unsensitized quinonediazide in the exposed area. Thus it differs from the subject matter in the present invention.

The organic alkali developer used in this invention is an aqueous solution of a quaternary ammonium hydroxide represented by the following formula (I):

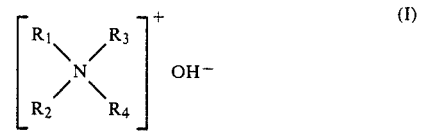

wherein $R_1$, $R_2$, $R_3$, and $R_4$ are each an alkyl group having 1 to 4 carbon atoms or a hydroxyalkyl group having 1 to 5 carbon atoms.

Typical examples of this compound which are commercially available are $(CH_3)_4NOH$ and $(HOCH_2CH_2)(CH_3)_3NOH$. The former is sold under trade names of NMD-3 and SOPD by Tokyo Ohka Kogyo Co., Ltd. and Sumitomo Chemical Co., Ltd., respectively, and the latter is sold under a trade name of TMK (Cicaclean) by Kanto Kagaku Co., Ltd. These products are used in the form of an aqueous solution having a concentration of 2 to 5 wt %. These products are purified as far as possible so as to minimize the fluctuation of development characteristics caused by alkalinity and impurities such as amines and other alkali substances, fatty acids and other organic acids, organic compounds, and metal ions. Such a pure developer keeps a stable alkalinity but does not work almost completely when there exists an unsensitized quinonediazide in the exposed area.

In order to solve the above-mentioned problems, the present inventors carried out a series of researches and found that the unsensitized quinonediazide and novolak resin undergo the coupling reaction to form an alkali insoluble products. Based on this finding, the present inventors devised a new developer which exhibits its own performance even when there exists an unsensitized quinonediazide in the exposed area.

SUMMARY OF THE INVENTION

Accordingly, it is an object of this invention to provide an organic alkali devloper for quinonediazide type positive photoresists. The developer of this invention not only further improves the sensitivity and resolution of the photoresist but also provides fine patterns thinner than 1 μm with good dimension precision, with a minimum of the development variation and the formation of defective patterns caused thereby.

The gist of the invention resides in a developer for quinonediazide type positive photoresists which comprises an aqueous solution of a quaternary ammonium hydroxide represented by the formula (I):

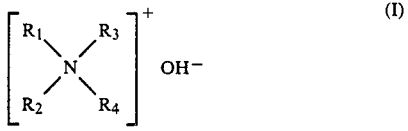

wherein $R_1$, $R_2$, $R_3$, and $R_4$ are each on alkyl group having 1 to 4 carbon atoms or a hydroxyalkyl group having 1 to 5 carbon atoms, and one more of development modifiers selected from the group consisting of water-soluble aliphatic ketones, cyclic ethers, and tertiary amines, the development modifier(s) being added to the developer in an amount of 5 to 1000 ppm.

These and other objects and advantages of the invention will be apparent to persons skilled in the art from the following description.

DETAILED DESCRIPTION OF THE INVENTION

As described above, the unsensitized quinonediazide and novolak resin form a coupling product (referred to as an insoluble azocoupling product hereinafter), in the presence of an alkali. As a good solvent for the insoluble azocoupling product, water-soluble (i.e., soluble in the developer) aliphatic ketones, cyclic ethers, and tertiary amines can be used. Examples of the aliphatic ketones which can be used are those having 3 to 8 carbon atoms, such as acetone, methyl ethyl ketone, diethyl ketone, and methyl isobutyl ketone, with acetone and methyl isobutyl ketone being preferred. Examples of the cyclic ethers which can be used are 3- to 6-membered alicyclic ethers, such as trimethylene oxide, tetrahydrofuran, tetrahydropyran, dioxane, and 1,3,5-trioxane, with tetrahydrofuran and dioxane being preferred. Examples of the tertiary amines which can be used are aliphatic tertiary amines having 3 to 6 carbon atoms, such as trimethylamine, trimethylamine oxide, triethylamine, and triethylamine oxide, with trimethylamine being preferred. These substances are added to the developer in an amount of 5 to 1000 ppm (weight by weight: hereinafter, referred to as w/w), preferably 10 to 200 ppm (w/w).

The developer of this invention solves such problems as variation of dimension precision caused by defective development and uneven development, which are involved in the conventional developers. In other words, the developer of this invention surprisingly provides precise fine patterns with sacrifice of a slight decrease in the ratio of remaining photoresist film. The developer of this invention produces a remarkable effect in the case where the resist film has an initial thickness greater than 1.5 μm. In such a case, development of patterns as small as 1.0 μm is possible.

The second feature of this invention is that the developer contains as a second development modifier a small amount of a primary amine and/or a secondary amine in addition to the solvent for the insoluble azocoupling product. The amines inhibit the above-mentioned coupling and improve the ratio of remaining photoresist film, the development rate, and the dimension precision.

As known in the field of organic synthesis, a quinonediazide forms an extremely reactive anti-trans diazotate upon contact with an alkali. It is also known that this diazotate reacts very rapidly with a primary amine or a secondary amine.

The reaction product of a quinonediazide with a primary or secondary amine which is formed in the presence of an alkali is insoluble in an alkali; therefore, it rather functions as a protecting film for the resist substrate, resulting in a decrease of development rate. It is, however, also true that this function reservely improves the ratio of remaining photoresist film and the resolution. This is the reason why the developer of this invention may contain both a solvent for the insoluble azo-coupling product and a primary amine and/or a secondary amine as a coupling inhibitor. They synergistically improve the development performance and make it possible to develop patterns as small as 0.8 μm, which were quite unthinkable in the past.

The primary and secondary amines used in this invention are water-soluble aliphatic primary amines having 1 to 2 carbon atoms and aliphatic secondary amines having 2 to 5 carbon atoms. Examples of such amines include monomethylamine, monoethylamine, dimethylamine, diethylamine, piperazine, and piperidine, with monoethylamine, dimethylamine and piperazine being preferred. They are added to the developer in an amount of 5 to 500 ppm (w/w), preferably 10 to 200 ppm (w/w). The developer containing both the coupling inhibitor and the solvent for the insoluble azocoupling product greatly improves the ratio of remaining photoresist film and the resolution.

EXAMPLE 1

A 3-inch N-type silicon wafer was washed successively with acetone and trichloroethylene and then dried in a clean oven at 120° C. for 30 minutes. An OFPR-800 positive photoresist was coated onto the thus pretreated silicon wafer by using a spin coater at 3800 rpm. The coated silicon wafer was prebaked in a clean oven at 90° C. for 40 minutes to form a 1.5. μm thick resist film.

The coated silicon wafer was exposed to light for 6 seconds through a test pattern photomask by using a Kasper Model 2001 contact mask aligner.

The developer used as a control was a commercially available 2.38 wt % tetramethylammonium hydroxide aqueous solution which was substantially pure but contained 1.5 ppm (w/w) of acetone, 3 ppm (w/w) of trimethylamine, 1.0 ppm (w/w)of dimethylamine, 0.5 ppm (w/w) of monomethylamine, and 1.0 ppm (w/w) of ammonia.

A developer of this invention was prepared by adding a development modifier to the above-mentioned commercially available 2.38 wt % tetramethylammonium hydroxide aqueous solution under a nitrogen atmosphere. The development modifiers used were acetone, methyl isobutyl ketone, tetrahydrofuran, dioxane, and trimethylamine, respectively. Their quantities added are shown in Table 1.

The exposed silicon wafer was dipped in 200 ml of the developer placed in a temparature controlled bath, and development was carried out at 21±0.5° C. for 70 seconds. After the development, the silicon wafer was rinsed twice with deionized water for 5 minutes each and then dried in a clean oven at 60° C. for 10 minutes.

The silicon wafer was examined under a scanning electron microscope to count defects out of a hundred of straight lines in the resist pattern (ratio of defective pattern), each measuring 1.0 μm wide and and 11.8 μm long. The defect was an undissolved photoresist locally remaining in the corner. At the same time, the thickness of the resist film remaining undissolved was measured. Further, the ratio of reamining photoresist film was measured using a Talystep step-height measuring instrument. The results are shown in Table 1.

TABLE 1

| No. | Developer | Ratio of Defective Pattern (%) | Ratio of Remaining Photoresist Film (%) |
|---|---|---|---|
| 1. | Commercially available 2.38% tetramethylammonium hydroxide aqueous solution | 24 | 95 |
| 2. | 2.38% tetramethylammonium hydroxyde aqueous solution containing 50 ppm (w/w) acetone | 1 | 94 |
| 3. | 2.38% tetramethylammonium hydroxide aqueous solution containing 40 ppm (w/w) of methyl isobutyl ketone | 5 | 94 |
| 4. | 2.38% tetramethylammonium hydroxide aqueous solution containing 120 ppm (w/w) tetrahydrofuran | 7 | 95 |
| 5. | 2.38% tetramethylammonium hydroxide aqueous solution containing 80 ppm (w/w) dioxane | 2 | 94 |
| 6. | 2.38% tetramethylammonium hydroxide aqueous solution containing 60 ppm (w/w) trimethylamine | 4 | 93 |

EXAMPLE 2

The silicon wafer pretreatment, the photoresist coating, and the light exposure were performed in the same way as in Example 1.

The developer used as a control was a commercially available 4.53 wt % trimethylethanolammonium hydroxide aqueous solution which was substantially pure.

The developer of this invention was prepared by adding a slight amount of a development modifier to the above-mentioned commercially available 4.53 wt % trimethylethanolammonium hydroxide aqueous solution under a nitrogen atmosphere. The development modifiers used were acetone, dioxane, and trimethylamine, respectively. Their quantities added are shown in Table 2.

After the development, the developed pattern was examined in the same way as in Example 1. The results are shown in Table 2.

TABLE 2

| No. | Developer | Ratio of Defective Pattern (%) | Ratio of Remaining Photoresit Film (%) |
|---|---|---|---|
| 7. | Commercially available 4.53% trimethylethanolammonium hydroxide aqueous solution | 43 | 92 |
| 8. | 4.53% trimethylethanolammonium hydroxide aqueous solution containing 50 ppm (w/w) acetone | 8 | 91 |
| 9. | 4.53% trimethylethanolammonium hydroxide aqueous solution containing 110 ppm (w/w) dioxane | 13 | 91 |
| 10. | 4.53% trimethylethanolammonium hydroxide aqueous solution containing 70 ppm (w/w) trimethylamine | 17 | 89 |

EXAMPLE 3

The silicon wafer pretreatment, the photoresist coating, and the light exposure were performed in the same way as in Example 1.

The developer used as a control was a 2.38 wt % tetramethylammonium hydroxide aqueous solution.

The developer of this invention was prepared by adding 30 ppm of acetone (as the development modifier) to the above-mentioned 2.38 wt % tetramethylammonium hydroxide aqueous solution.

Development was carried out in the following three different ways.

(1) Dip-stir method:

The exposed silicon wafer was dipped and developed by moving up and down for 70 seconds in 200 ml of developer at 21° C. in a temperature controlled bath. After the development, the silicon wafer was rinsed with deionized wafer.

(2) Meniscus development method:

The exposed silicon wafer was mounted on a spin coater, and the developer was dropped on the silicon wafer so that it stayed in the convex form on the wafer. After standing for 70 seconds, the developer was wiped off and the silicon wafer was rinsed with deionized water.

(3) Spray development method:

The exposed silicon wafer was mounted on a spin coater, and while rotating at 200 rpm, the wafer was sprayed and developed with the developer at a pressure of 30 psi for 1 minute. The feed rate of the developer was 3 ml/min. After the development, the silicon wafer was rinsed with deionized water.

The developed pattern was examined in the same way as in Example 1. The results are shown in Table 3.

TABLE 3

| No. | Developer | Development Method | Ratio of Defective Pattern (%) | Ratio of Remaining Photoresist Film (%) |
|---|---|---|---|---|
| 11. | 2.38% tetramethylammonium hydroxide aqueous solution | Dip-stir method | 19 | 93 |
| 12. | 2.38% tetramethylammonium hydroxide aqueous solution | Meniscus development method | 12 | 85 |
| 13. | 2.38% tetramethylammonium hydroxide aqueous solution | Spray development method | 16 | 89 |
| 14. | 2.38% tetramethylammonium hydroxide aqueous solution containing 30 ppm (w/w) acetone | Dip-stir method | 0 | 91 |
| 15. | 2.38% tetramethylammonium hydroxide aqueous solution containing 30 ppm (w/w) acetone | Meniscus development method | 0 | 83 |

TABLE 3-continued

| No. | Developer | Development Method | Ratio of Defective Pattern (%) | Ratio of Remaining Photoresist Film (%) |
|---|---|---|---|---|
| 16. | 2.38% tetramethyl-ammonium hydroxide aqueous solution containing 30 ppm (w/w) acetone | Spray development method | 0 | 88 |

EXAMPLE 4

After the same pretreatment as in Example 1, the silicon wafer was treated with hexamethyldisilazane. A 1-μm thick resist film was formed on the wafer by using a spin coater. Light exposure was performed for varied lengths of time (0.2, 0.5, 1, 1.5, 2, 2.5, 3, 4, 5, and 6 seconds) through a photomask having a pattern of 0.8 μm wide lines.

The developer used as a control was a 2.38 wt % tetramethylammonium hydroxide aqueous solution.

The developer of this invention was prepared by adding a development modifier to the above-mentioned 2.38 wt % tetramethylammonium hydroxide aqueous solution. The development modifiers used were 50 ppm (w/w) of acetone; 30 ppm (w/w) of acetone and 20 ppm (w/w) of dimethylamine in combination thereof; and 30 ppm (w/w) of acetone and 30 ppm (w/w) of piperazine in combination thereof.

Development was performed for 60 seconds by a dip method. After the development, the developed pattern was examined on sensitivity, gamma value, ratio of remaining photoresist film, and defective development with a patter of 0.8 μm wide lines. (Sensitivity is the exposure time required for the resist film to be developed completely. Gamme value is a measure of lithographic contrast and a value defined by the following equation:

Gamma = (log $R_2$ − log $R_1$)/(log $E_2$ − log $E_1$)

(wherein it is assumed that the development rate of the exposed area changes from $R_1$ to $R_2$ when the exposure energy changes from $E_1$ to $E_2$.) Gamma is an index representing resolution. The greater the gamma value, the greater the development rate changes in response to the change of exposure and the sharper the resulting pattern.)

The results are shown in Table 4.

TABLE 4

| No. | Developer | Sensitivity (sec) | Gamma Value | Ratio of Defection Pattern (%) | Ratio of Remaining Photoresist Film (%) |
|---|---|---|---|---|---|
| 17. | 2.38% tetramethylammonium hydroxide aqueous solution | 4 | 1.87 | 79 | 92 |
| 18. | 2.38% tetramethylammonium hydroxide aqueous solution containing 50 ppm (w/w) acetone | 4 | 1.80 | 36 | 90 |
| 19. | 2.38% tetramethylammonium hydroxide aqueous solution containing 30 ppm (w/w) acetone and 20 ppm (w/w) dimethylamine | 3 | 2.20 | 2 | 94 |
| 20. | 2.38% tetramethylammonium hydroxide aqueous solution containing 30 ppm (w/w) acetone and 30 ppm (w/w) piperazine | 3 | 2.50 | 4 | 94 |

EXAMPLE 5

After the same pretreatment as in Example 1, the silicon wafer was treated with hexamethyldisilazane. A 1-μm thick resist film was formed on the wafer by using a spin coater. Light exposure was performed for varied lengths of time (0.2, 0.5, 1, 1.5, 2, 2.5, 3, 4, 5, and 6 seconds) through a photomask having a pattern of 0.8 μm wide lines.

The developer used as a control was a 4.53 wt % trimethylethanolammonium hydroxide aqeuous solution.

The developer of this invention was prepared by adding a development modifier to the above-mentioned 4.53 wt % trimethylethanolammonium hydroxide aqueous solution. The development modifiers used were 150 ppm(w/w) of dioxane; 120 ppm (w/w) of dioxane and 120 ppm (w/w) of monoethylamine in combination thereof; and 120 ppm(w/w) of dioxane and 50 ppm (w/w) of dimethylamine in combination thereof.

Development was performed for 60 seconds by a dip method. After the development, the developed pattern was examined on sensitivity, gamma value, ratio of remaining photoresist film, and defective development.

The results are shown in Table 5.

TABLE 5

| No. | Developer | Sensitivity (sec) | Gamma Value | Ratio of Defective Pattern (%) | Ratio of Remaining Photoresist Film (%) |
|---|---|---|---|---|---|
| 21. | 4.53% trimethylethanolammonium hydroxide | 4.5 | 1.70 | 82 | 91 |
| 22. | 4.53% trimethylethanolammonium hydroxide aqueous solution containing 150 ppm (w/w) dioxane | 4 | 1.75 | 43 | 89 |
| 23. | 4.53% trimethylethanolammonium hydroxide | 4 | 1.89 | 11 | 92 |

TABLE 5-continued

| No. | Developer | Sensitivity (sec) | Gamma Value | Ratio of Defective Pattern (%) | Ratio of Remaining Photoresist Film (%) |
|---|---|---|---|---|---|
|  | aqueous solution containing 120 ppm (w/w) dioxane and 120 ppm (w/w) monoethylamine |  |  |  |  |
| 24. | 4.53% trimethylethanolammonium hydroxide aqueous solution containing 120 ppm (w/w) of dioxane and 50 ppm (w/w) of dimethylamine | 4 | 1.87 | 9 | 93 |

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A developer for positive photoresists consisting essentially of a 2 to 5 wt % aqueous solution of a quaternary ammonium hydroxide represented by the formula (I):

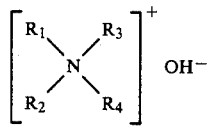

wherein $R_1$, $R_2$, $R_3$, and $R_4$ are each an alkyl group having 1 to 4 carbon atoms or a hydroxyalkyl group having 1 to 5 carbon atoms, and at least one development modifier selected from the group consisting of water-soluble aliphatic ketones and water-soluble cyclic ethers, said development modifier being added to the developer in an amount of 10 to 200 ppm (w/w).

2. A developer for positive photoresists consisting essentially of a 2 to 5 wt % aqueous solution of a quaternary ammonium hydroxide represented by the formula (I):

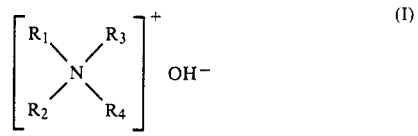

wherein $R_1$, $R_2$, $R_3$, and $R_4$ are each an alkyl group having 1 to 4 carbon atoms or a hydroxyalkyl group having 1 to 5 carbon atoms, at least one first development modifier selected from the group consisting of water-soluble aliphatic ketones and water soluble cyclic ethers, and at least one second development modifier selected from the group consisting of water-soluble primary amines and water-soluble secondary amines, said first development modifier being added to the developer in an amount of 10 to 200 ppm (w/w) and said second development modifier being added to the developer in an amount of 10 to 200 ppm (w/w).

3. A developer for positive photoresists as recited in claim 1, wherein the water-soluble aliphatic ketones are aliphatic ketones having 3 to 8 carbon atoms and the water-soluble cyclic ethers are 3- to 6-membered alicyclic ethers and.

4. A developer for positive photoresists as recited in claim 2, wherein the water-soluble aliphatic ketones are aliphatic ketones having 3 to 8 carbon atoms and the cyclic ethers are 3- to 6-membered alicyclic ethers and; and the water-soluble primary amines are aliphatic primary amines having 1 to 2 carbon atoms, and the water-soluble secondary amines are aliphatic secondary amines having 2 to 5 carbon atoms.

5. A developer for positive photoresists as recited in claim 1, wherein the aqueous solution of quaternary ammonium hydroxide represented by the formula (I) is an aqueous solution of tetramethylammonium hydroxide or trimethylethanolammonium hydroxide.

6. A developer for positive photoresists as recited in claim 2, wherein the aqueous solution of quaternary ammonium hydroxide represented by the formula (I) is an aqueous solution of tetramethylammonium hydroxide or trimethylethanolammonium hydroxide.

7. A developer for positive photorests as recited in claim 5, wherein the development modifier is acetone, methyl isobutyl ketone, tetrahydrofuran or dioxane.

8. A developer for positive photoresists as recited in claim 6, wherein the first development modifier is acetone, methyl isobutyl ketone, tetrahydrofuran or dioxane; and the second development modifier is monoethylamine dimethylamine, or piperazine.

* * * * *